US009602003B2

United States Patent
Otsuka

(10) Patent No.: US 9,602,003 B2
(45) Date of Patent: Mar. 21, 2017

(54) VOLTAGE REGULATOR, SEMICONDUCTOR DEVICE, AND VOLTAGE GENERATION METHOD FOR VOLTAGE REGULATOR

(71) Applicant: LAPIS Semiconductor Co., Ltd., Yokohama (JP)

(72) Inventor: Masayuki Otsuka, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/133,215

(22) Filed: Apr. 19, 2016

(65) Prior Publication Data

US 2016/0308446 A1    Oct. 20, 2016

(30) Foreign Application Priority Data

Apr. 20, 2015    (JP) ................................. 2015-085661

(51) Int. Cl.
    *H02M 3/158*    (2006.01)
(52) U.S. Cl.
    CPC .................. *H02M 3/158* (2013.01)
(58) Field of Classification Search
    CPC .................................................. H02M 3/158
    See application file for complete search history.

(56) References Cited

U.S. PATENT DOCUMENTS

2010/0001704 A1*    1/2010    Williams ............... H02M 3/158
                                                    323/283

FOREIGN PATENT DOCUMENTS

JP        2008-310703 A    12/2008

\* cited by examiner

*Primary Examiner* — Jeffrey Zweizig
(74) *Attorney, Agent, or Firm* — Rabin & Berdo, P.C.

(57) ABSTRACT

A voltage regulator includes: a drive voltage generating part for generating a drive voltage and then apply the drive voltage to a drive line; an output transistor for outputting a voltage corresponding to a voltage value of the drive line as the internal source voltage; and a compulsory drive circuit including a capacitor element configured to receive the source voltage at one end, a first switching element for receiving a ground voltage and applying the ground voltage to the other end of the capacitor element by being set in an ON state over a period in which the selected operational mode is the standby mode, and a second switching element that connects the other end of the capacitor element to the drive line only for a predetermined period in an ON state when the operational mode transitions from the standby mode to the active mode.

8 Claims, 3 Drawing Sheets

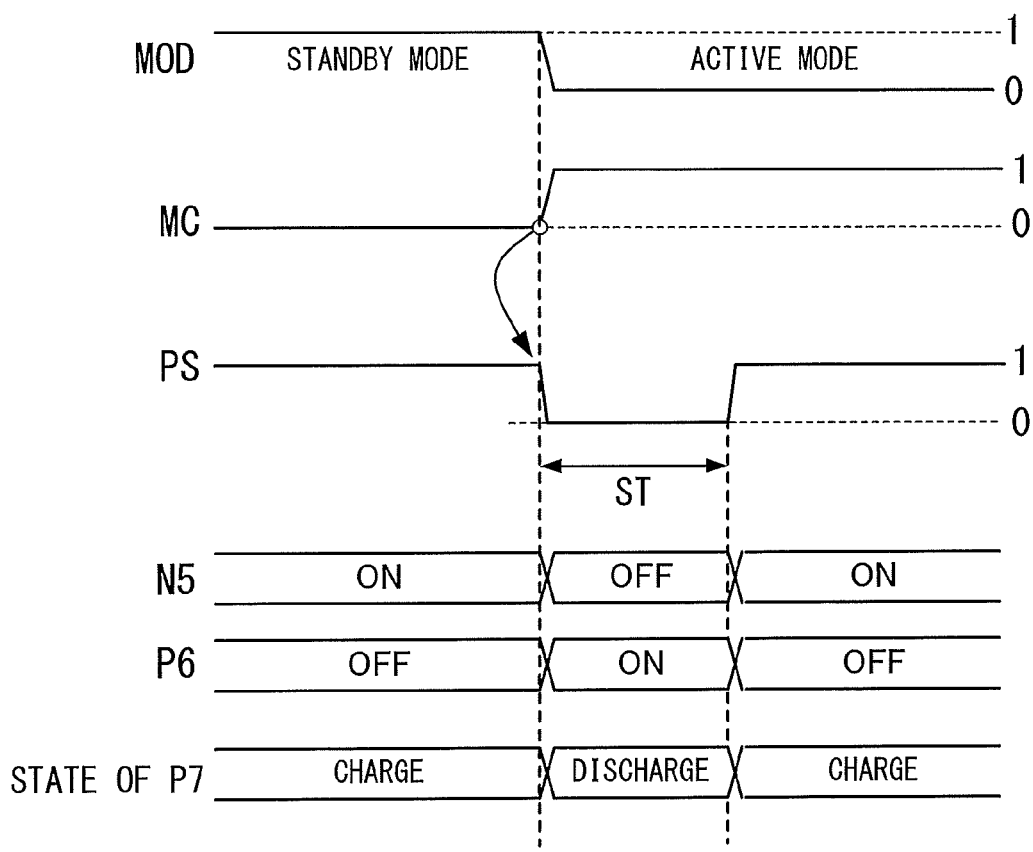

VOLTAGE REGULATOR, SEMICONDUCTOR DEVICE, AND VOLTAGE GENERATION METHOD FOR VOLTAGE REGULATOR

BACKGROUND OF THE INVENTION

1. Field of the Invention

The present invention relates to a voltage regulator, and in particular, a voltage regulator that generates an internal source voltage in either an active mode or a standby mode, a semiconductor device including the voltage regulator, and a voltage generation method for the voltage regulator.

2. Description of the Related Art

A semiconductor chip includes an internal circuit that assumes various functions and a voltage regulator that generates an internal source voltage for operating the internal circuit on the basis of a source voltage and supplies the internal source voltage to the internal circuit. The voltage regulator is provided with a differential amplification part that applies a drive voltage having a voltage value corresponding to a difference between the internal source voltage and a reference voltage to a gate terminal of an output transistor for outputting the internal source voltage in order to stabilize the voltage value of the internal source voltage regardless of load change in the internal circuit (see Japanese Patent Application Laid-Open No. 2008-310703, for example). Such a voltage regulator achieves a high-speed operation by increasing an amount of current flowed through the differential amplification part during an active mode. The voltage regulator achieves power saving by reducing an amount of current flowed through the differential amplification part during a standby mode.

SUMMARY OF THE INVENTION

As compared to the standby mode, load change in the internal circuit is large during the active mode. While the differential amplification part operates to stabilize the internal source voltage by causing the internal source voltage to follow the load change, such an operation is accompanied by delay. Thus, the above-described voltage regulator temporarily has a reduced internal source voltage immediately after the transition of its operational mode from the standby mode to the active mode.

It is an object of the present invention to provide a voltage regulator, a semiconductor device, and a voltage generation method for a voltage regulator, capable of preventing reduction in an internal source voltage immediately after transition from a standby mode to an active mode.

A voltage regulator according to the present invention is a voltage regulator configured to generate an internal source voltage on the basis of a source voltage in an operational mode is selected from either an active mode or a standby mode. The voltage regulator includes: a drive voltage generating part configured to generate a drive voltage and then apply the drive voltage to a drive line; an output transistor configured to output a voltage corresponding to a voltage value of the drive line as the internal source voltage; and a compulsory drive circuit including a capacitor element configured to receive the source voltage at one end, a first switching element configured to receive a ground voltage and apply the ground voltage to the other end of the capacitor element by being set in an ON state over a period in which the selected operational mode is the standby mode, and a second switching element that connects the other end of the capacitor element to the drive line only for a predetermined period in an ON state when the operational mode transitions from the standby mode to the active mode.

A semiconductor device according to the present invention is a semiconductor device including: a memory; and a voltage regulator configured to generate an internal source voltage on the basis of a source voltage in an operational mode is selected from either an active mode or a standby mode to supply the internal source voltage to the memory. The voltage regulator includes: a drive voltage generating part configured to generate a drive voltage and then apply the drive voltage to a drive line; an output transistor configured to output a voltage corresponding to a voltage value of the drive line as the internal source voltage; and a compulsory drive circuit including a capacitor element configured to receive the source voltage at one end, a first switching element configured to receive a ground voltage and apply the ground voltage to the other end of the capacitor element by being set in an ON state over a period in which the selected operational mode is the standby mode, and a second switching element that connects the other end of the capacitor element to the drive line only for a predetermined period in an ON state when the operational mode transitions from the standby mode to the active mode.

A voltage generation method in a voltage regulator according to the present invention is a voltage generation method in a voltage regulator that includes: a drive voltage generating part configured to generate a drive voltage and then apply the drive voltage to a drive line; an output transistor configured to output, on the basis of a source voltage, a voltage corresponding to a voltage value of the drive line as an internal source voltage; and a capacitor element, and operates in an operational mode is selected from a standby mode or an active mode. The voltage generation method in the voltage regulator includes: applying the source voltage to the one end of the capacitor element; applying a ground voltage to the other end of the capacitor element during a period in which the selected operational mode is the standby mode; and connecting the other end of the capacitor element to the drive line only for a predetermined period when the operational mode transitions from the standby mode to the active mode.

According to the present invention, the capacitor element is connected to the drive line to which the voltage for driving the output transistor is supplied when the operational mode transitions from the standby mode to the active mode. This allows the voltage value of the drive line to promptly reach a voltage value with which the output transistor can output a high current immediately after the transition from the standby mode to the active mode. Thus, the present invention can prevent reduction in the internal source voltage immediately after the transition from the standby mode to the active mode.

BRIEF DESCRIPTION OF THE DRAWINGS

FIG. 3 is a time chart showing operations of a compulsory drive circuit 18.

DETAILED DESCRIPTION OF THE INVENTION

An embodiment of the present invention will now be described below in detail with reference to the drawings.

Figure 1:
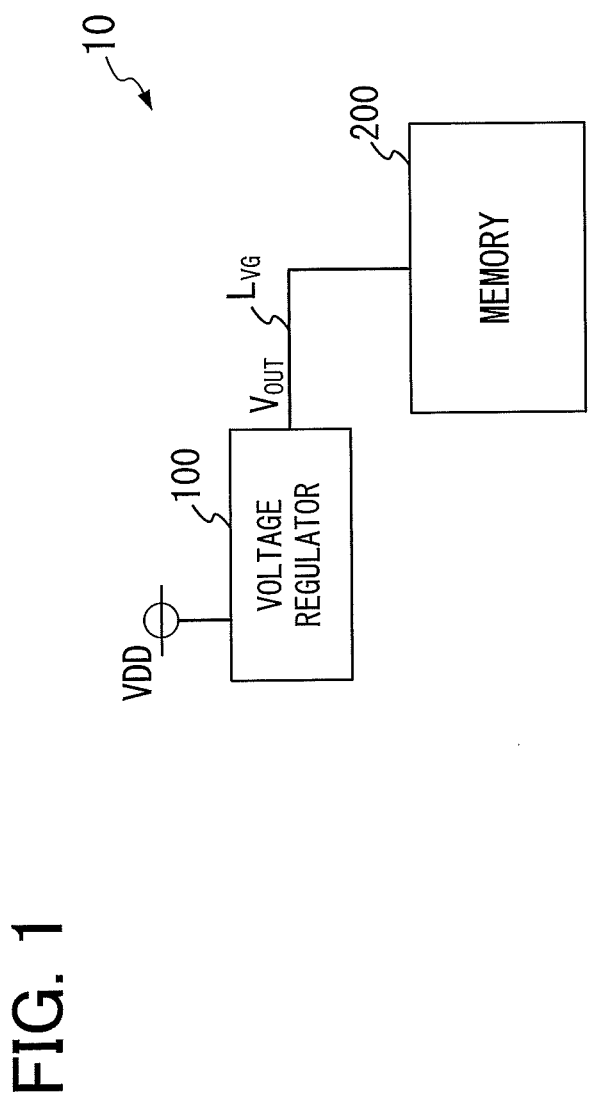
FIG. 1 is a block diagram illustrating a configuration of a semiconductor memory 10 including a voltage regulator 100 according to the present invention.

FIG. 1 is a block diagram illustrating a schematic configuration of a semiconductor memory 10 including a voltage regulator 100 according to the present invention.

The voltage regulator 100 generates an internal source voltage $V_{OUT}$ on the basis of a direct-current source voltage VDD externally supplied from, for example, a battery. The voltage regulator 100 supplies the internal source voltage $V_{OUT}$ to a memory 200, as an internal circuit, via an internal power-supply line $L_{VG}$. The voltage regulator 100 operates in an operational mode is selected from either a standby mode or an active mode. The memory 200 is a non-volatile memory such as a NAND or NOR flash memory, for example, operated by the above-described internal source voltage $V_{OUT}$.

Figure 2:
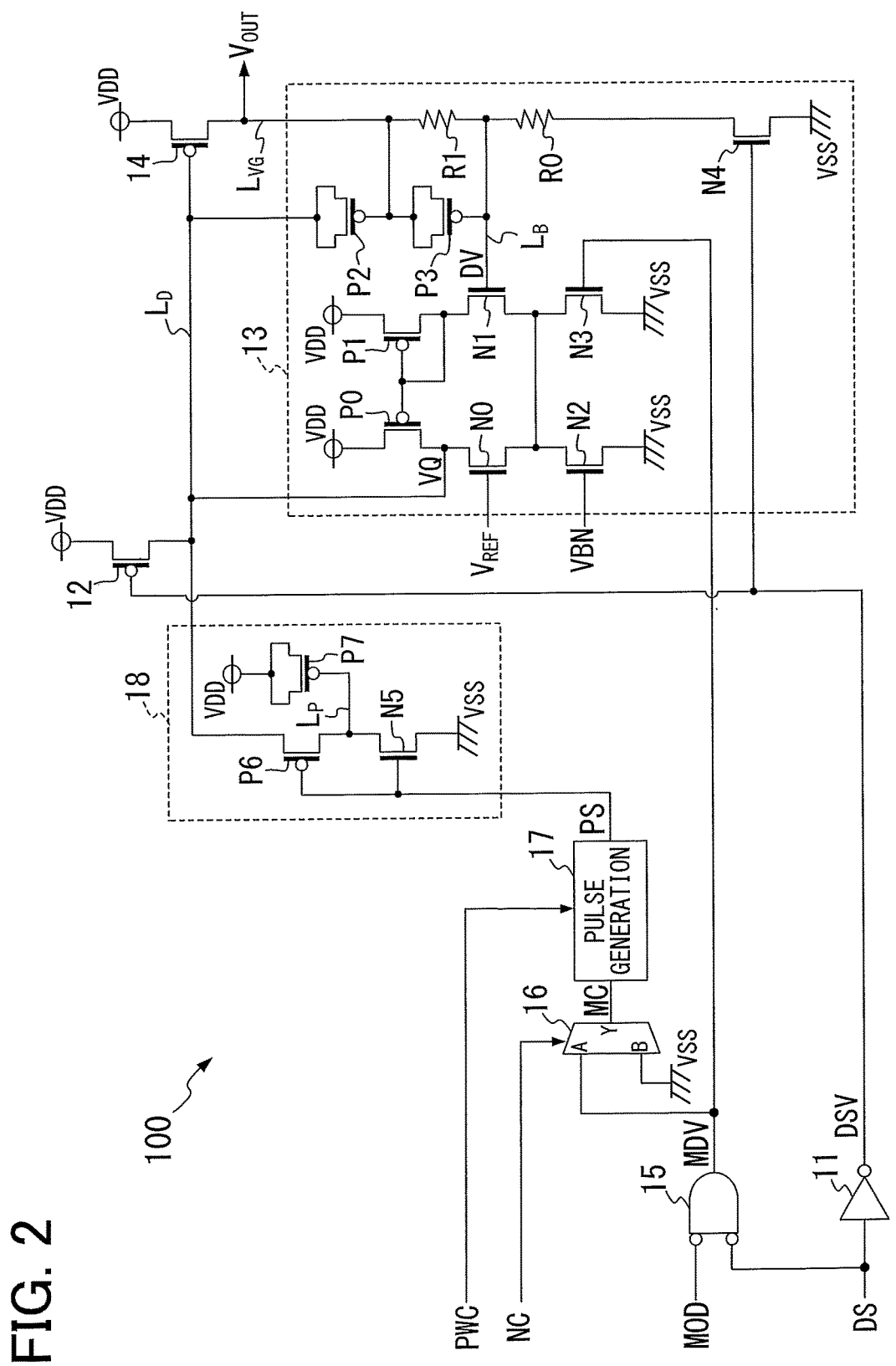
FIG. 2 is a circuit diagram illustrating a configuration of the voltage regulator 100.

FIG. 2 is a circuit diagram illustrating a configuration of the voltage regulator 100. As shown in FIG. 2, the voltage regulator 100 includes an inverter 11, a transistor 12, a drive voltage generation circuit 13, an output transistor 14, a NOR gate 15, a selector 16, a pulse generating part 17, and a compulsory drive circuit 18.

The inverter 11 provides an inverted disable signal DSV, which is obtained by inverting the logic level of a disable signal DS supplied from the outside of the voltage regulator 100, to a gate terminal of the transistor 12 and the drive voltage generation circuit 13.

For example, the disable signal DS having the logic level 1 represents that the voltage regulator 100 is disabled, whereas the disable signal DS having the logic level 0 represents that the voltage regulator 100 is enabled.

The transistor 12 is a p-channel metal-oxide-semiconductor (MOS) transistor. The source voltage VDD is applied to a source terminal of the transistor 12, and a drain terminal of the transistor 12 is connected to a drive line $L_D$.

The drive voltage generation circuit 13 includes: a differential amplification part including transistors P0 to P3, which are p-channel MOS transistors, and transistors N0 to N4, which are n-channel MOS transistors; and a voltage-dividing circuit configured by resistors R0 and R1.

A gate terminal of the transistor N0 is supplied with a reference voltage $V_{REF}$, and a source terminal thereof is connected to a source terminal of the transistor N1 and drain terminals of the transistors N2 and N3. A drain terminal of the transistor N0 is connected to a drain terminal of the transistor P0 and the drive line $L_D$. The source voltage VDD is applied to a source terminal of the transistor P0. A gate terminal of the transistor P0 is connected to a gate terminal of the transistor P1 and a drain terminal of the transistor P1. The gate terminal of the transistor P0 is connected to a drain terminal of the transistor N1. The source voltage VDD is applied to a source terminal of the transistor P1. A gate terminal of the transistor N1 is connected to a divided voltage line $L_B$. A gate terminal of the transistor N2 is supplied with a current consumption control voltage VBN. A ground voltage VSS is applied to a source terminal of the transistor N2. A gate terminal of the transistor N3 is provided with an inverted mode specification signal MDV sent out from the NOR gate 15. The ground voltage VSS is applied to a source terminal of the transistor N3.

A drain terminal of the transistor P2 and a source terminal of the transistor P2 are both connected to the drive line $L_D$. A gate terminal of the transistor P2 is connected to the internal power-supply line $L_{VG}$. A drain terminal of the transistor P3 and a source terminal of the transistor P3 are both connected to the internal power-supply line $L_{VG}$. A gate terminal of the transistor P3 is connected to the divided voltage line $L_B$. The transistors P2 and P3 operate as capacitor elements independent of each other.

One end of the resistor R1 is connected to the internal power-supply line $L_{VG}$, and the other end thereof is connected to the divided voltage line $L_B$ and one end of the resistor R0. The other end of the resistor R0 is connected to a drain terminal of the transistor N4. The resistors R0 and R1, as a voltage-dividing circuit, supply the following divided voltage DV, which is obtained by dividing the internal source voltage $V_{OUT}$ being applied to the internal power-supply line $L_{VG}$, to the gate terminal of the transistor N1 via the divided voltage line $L_B$.

$$DV=V_{OUT}[R0/(R0+R1)]$$

The inverted disable signal DSV is provided to a gate terminal of the transistor N4. The ground voltage VSS is applied to a source terminal of the transistor N4.

The source voltage VDD is applied to a source terminal of the output transistor 14. A gate terminal of the output transistor 14 is connected to the drive line L. A drain terminal of the output transistor 14 is connected to the internal power-supply line $L_{VG}$.

With the above-described configuration, the drive voltage generation circuit 13 generates a drive voltage VQ having a voltage value corresponding to a difference between the reference voltage $V_{REF}$ and the divided voltage DV obtained by dividing the internal source voltage $V_{OUT}$ sent out from the output transistor 14. The drive voltage generation circuit 13 then applies the drive voltage VQ to the drive line $L_D$.

When the disable signal DS has the logic level 0, i.e., when the voltage regulator 100 is enabled, the NOR gate 15 generates a signal, as the inverted mode specification signal MDV, by inverting the logic level of a mode specification signal MOD. For example, the mode specification signal MOD has the logic level 0 when specifying the active mode as the operational mode and has the logic level 1 when specifying the standby mode. In other words, the mode specification signal MOD specifies which operational mode, either the active mode or the standby mode, is employed for operating the voltage regulator 100.

When the disable signal DS has the logic level 1, i.e., when the voltage regulator 100 is disabled, the NOR gate 15 generates the inverted mode specification signal MDV having the logic level 0.

The NOR gate 15 provides the thus generated inverted mode specification signal MDV to the selector 16 and the gate terminal of the transistor N3 in the drive voltage generation circuit 13.

The selector 16 selects one of the ground voltage VSS corresponding to the logic level 0 and the inverted mode specification signal MDV on the basis of a compulsory drive disabling signal NC and provides a mode transition signal MC having the selected level to the pulse generating part 17. For example, in case of disabling the compulsory drive circuit 18 supplies the compulsory drive disabling signal NC having the logic level 1 to the selector 16. For example, in case of enabling the compulsory drive circuit 18 supplies the compulsory drive disabling signal NC having the logic level 0 to the selector 16.

More specifically, the selector 16 selects the inverted mode specification signal MDV when the compulsory drive disabling signal NC representing that the compulsory drive circuit 18 is enabled is provided. The selector 16 then provides the mode transition signal MC, having the level represented by this inverted mode specification signal MDV, to the pulse generating part 17. When the compulsory drive disabling signal NC representing that the compulsory drive circuit 18 is disabled is provided, on the other hand, the selector 16 provides the mode transition signal MC having the logic level 0 to the pulse generating part 17.

As shown in FIG. 3, when the externally-provided mode transition signal MC transitions from the logic level 0 to the logic level 1, the pulse generating part 17 generates a compulsory drive pulse signal PS having the logic level 0 only for a predetermined pulse duration ST from the transition point and having the logic level 1 during other period. More specifically, the pulse generating part 17 generates the compulsory drive pulse signal PS that has the logic level 1 while the mode specification signal MOD is representing the standby mode and has the logic level 0 only for the pulse duration ST from the transition point at which the mode specification signal MOD transitions from the state representing the standby mode to the state representing the active mode. The pulse generating part 17 provides the compulsory drive pulse signal PS to the compulsory drive circuit 18. The pulse generating part 17 adjusts the pulse duration ST on the basis of an externally-provided pulse duration adjustment signal PWC.

The compulsory drive circuit 18 includes transistors P6 and P7, which are p-channel MOS transistors, and a transistor N5, which is an n-channel MOS transistor.

The ground voltage VSS is applied to a source terminal of the transistor N5. The compulsory drive pulse signal PS is provided to a gate terminal of the transistor N5. A drain terminal of the transistor N5 is connected to a drain terminal of the transistor P6 and a gate terminal of the transistor P7 via a line $L_P$. A gate terminal of the transistor P6 is provided with the compulsory drive pulse signal PS. A source terminal of the transistor P6 is connected to the drive line $L_D$. The source voltage VDD is applied to both of a drain terminal of the transistor P7 and a source terminal of the transistor P7. A gate terminal of the transistor P7 is connected to the line $L_P$. With such connection, the transistor P7 functions as a capacitor element having the source terminal and the drain terminal connected to each other as one end and the gate terminal as the other end.

Operations of the voltage regulator 100 having the above-described configuration will now be described below.

To disable the voltage regulator 100, the disable signal DS having the logic level 1, which represents disabling, and the current consumption control voltage VBN having a voltage value corresponding to the logic level 0 are first provided to the voltage regulator 100. This sets the transistor 12 in an ON state. The source voltage VDD is thus applied to the drive line $L_D$ via the transistor 12, making the output transistor 14 fixed in an OFF state. Furthermore, the disable signal DS having the logic level 1 and the current consumption control voltage VBN make the transistors N2 to N4 in the drive voltage generation circuit 13 fixed in an OFF state, thus stopping the operation of the drive voltage generation circuit 13.

Since the internal power-supply line $L_{VG}$ is in a high-impedance state and the operation of the drive voltage generation circuit 13 is stopped, the operation of the voltage regulator 100 is stopped.

To enable the voltage regulator 100, the disable signal DS having the logic level 0, which represents enabling, and the current consumption control voltage VBN having a voltage value higher than the voltage value of the logic level 0 are supplied to the voltage regulator 100. This terminates the OFF-state fixation in the output transistor 14 and sets the drive voltage generation circuit 13 in an operating state. Consequently, the output transistor 14 generates, on the basis of the source voltage VDD, the internal source voltage $V_{OUT}$ according to the drive voltage VQ generated in the drive voltage generation circuit 13. The output transistor 14 then outputs the internal source voltage $V_{OUT}$ via the internal power-supply line $L_{VG}$.

When the mode specification signal MOD representing the active mode is provided to the voltage regulator 100, the transistor N3 in the drive voltage generation circuit 13 is set in an ON state according to the inverted mode specification signal MDV having a voltage value corresponding to the logic level 1. Furthermore, the current consumption control voltage VBN having a voltage value higher than the voltage value of the logic level 0 is supplied to the transistor N2 in the active mode, thus setting the transistor N2 in an ON state. Consequently, a bias current flows through the differential amplification part (P0, P1, and N0 to N3) via the transistors N2 and N3, and the drive voltage generation circuit 13 generates the drive voltage VQ as will be described below.

More specifically, the voltage-dividing circuit (R0 and R1) included in the drive voltage generation circuit 13 first supplies the divided voltage DV, which is obtained by dividing the internal source voltage $V_{OUT}$, to the differential amplification part (P0, P1, and N0 to N3). The differential amplification part generates the drive voltage VQ having a voltage value corresponding to a difference between the divided voltage DV and the reference voltage $V_{REF}$. The differential amplification part then supplies the drive voltage VQ to the gate terminal of the output transistor 14 via the drive line $L_D$.

Thus, even when the voltage value of the internal source voltage $V_{OUT}$ changes with load change in the memory 200 as an internal circuit, the above-described feedback operation by the drive voltage generation circuit 13 allows the changed voltage value to converge to a fixed voltage value corresponding to the reference voltage $V_{REF}$. In the active mode, a relatively large current can be flowed through the differential amplification part by the transistors N2 and N3. Thus, the internal source voltage $V_{OUT}$ can quickly respond to changes in its voltage value, thereby stabilizing the internal source voltage $V_{OUT}$.

When the mode specification signal MOD representing the standby mode is provided to the voltage regulator 100, the transistor N3 is set in an OFF state according to the inverted mode specification signal MDV having the logic level 0. In other words, the differential amplification part flows current only in the transistor N2 of the transistors N2 and N3. Thus, although the internal source voltage $V_{OUT}$ having a fixed voltage value is generated also in the standby mode as with the active mode, the response speed is lowered due to the reduced level of current flowing through the differential amplification part as compared to the active mode. In the standby mode, however, power consumption can be reduced as compared to the active mode since no current flows through the transistor N3.

As shown in FIG. 3, when the mode specification signal MOD transitions from the state representing the standby mode to the state representing the active mode, the mode transition signal MC that transitions from the logic level 0 to the logic level 1 accordingly is provided to the pulse generating part 17.

As shown in FIG. 3, the pulse generating part 17 generates the compulsory drive pulse signal PS having the logic level 0 only for the pulse duration ST from the transition point of the mode transition signal MC from the logic level 0 to the logic level 1 and having the logic level 1 during other period. In other words, when the operational mode transitions from the standby mode to the active mode, the pulse generating part 17 generates the compulsory drive pulse signal PS having the logic level 0 in order to cause compulsory drive processing to be performed only for the pulse duration ST. The pulse generating part 17 provides the compulsory drive pulse signal PS to the compulsory drive circuit 18.

While the mode specification signal MOD is in the state representing the standby mode, the transistor P6 in the compulsory drive circuit 18 is in an OFF state and the transistor N5 is in an ON state as shown in FIG. 3. Thus, during such a period, the ground voltage VSS is applied to the gate terminal of the transistor P7 as a capacitor element and the transistor P7 is thereby charged. This leads to the formation of a channel in the transistor P7. Consequently, negative charge is accumulated in the gate terminal of the transistor P7, and positive charge is accumulated in the drain terminal and the source terminal thereof.

In the standby mode, a load in the memory 200 is small and the amount of corresponding voltage change is therefore small. Thus, the drive voltage VQ generated in the drive voltage generation circuit 13 has a high voltage value, and an output current in the output transistor 14 is small. In the active mode, on the other hand, load change in the memory 200 increases and the amount of corresponding voltage change also increases. Thus, the voltage value of the drive voltage VQ needs to be reduced according to such voltage change and the output current of the output transistor 14 needs to be increased in the drive voltage generation circuit 13. In the drive voltage generation circuit 13, however, delay occurs before the drive voltage VQ is generated according to the internal source voltage $V_{OUT}$. Thus, while load change in the memory 200 increases immediately after the transition from the standby mode to the active mode, the drive voltage generation circuit 13 cannot immediately reduce the voltage value of the drive voltage VQ following such load change. Therefore, if load change in the memory 200 is large immediately after the transition from the standby mode to the active mode, the internal source voltage $V_{OUT}$ decreases. If the size of the output transistor 14 or each transistor (P0, P1, N0 to N3) in the differential amplification part is increased in order to prevent the reduction in the internal source voltage $V_{OUT}$ in such a situation, the amount of power consumption is disadvantageously increased.

In view of this, the voltage regulator 100 is provided with the compulsory drive circuit 18, so that the transistor P6 is set in an ON state and the transistor N5 is set in an OFF state only for the pulse duration ST from the transition point at which the operational mode transitions from the standby mode to the active mode as shown in FIG. 3. Thus, the gate terminal of the transistor P7 as a capacitor element is connected to the drive line $L_D$ via the transistor P6 during such a period. Consequently, the transistor P7 is discharged, current flows into the transistor P7 from the drive line $L_D$, and the voltage in the drive line $L_D$ immediately decreases (compulsory drive processing). Such compulsory drive processing allows the output transistor 14 to instantly reach a state capable of outputting a high current irrespective of the drive voltage VQ generated in the drive voltage generation circuit 13.

Thus, the above-described compulsory drive processing by the compulsory drive circuit 18 can prevent reduction in the internal source voltage $V_{OUT}$ at the transition point from the standby mode to the active mode without increasing the size of the transistors, i.e., without increasing power consumption.

In the compulsory drive circuit 18, a certain amount of charge is accumulated in the transistor P7 as a capacitor element by applying the ground voltage VSS to the gate terminal of the transistor P7 over the period of the standby mode. Consequently, a fixed voltage value can be constantly applied to the drive line $L_D$ in the compulsory drive processing performed immediately after the transition from the standby mode to the active mode. The compulsory drive processing is thus performed in a stable manner.

When the overshoot of the internal source voltage due to the compulsory drive processing by the compulsory drive circuit 18 becomes a problem in the voltage regulator 100, the compulsory drive circuit 18 can be disabled by the compulsory drive disabling signal NC. At this time, the compulsory drive disabling signal NC having the logic level 1 is provided to the voltage regulator 100. This causes the selector 16 to provide the mode transition signal MC having the logic level 0 to the pulse generating part 17. Consequently, the pulse generating part 17 applies the compulsory drive pulse signal PS fixed at the logic level 1 to the gate terminal of the transistor P6 in the compulsory drive circuit 18. This sets the transistor P6 in an OFF state and the compulsory drive circuit 18 thus has a high-impedance output. The transistor P7 is therefore prevented from being connected to the drive line $L_D$ even when the operational mode specified by the mode specification signal MOD transitions from the standby mode to the active mode. No compulsory drive processing is thus performed by the compulsory drive circuit 18.

In the above-described embodiment, the operation of the present invention has been described with the voltage regulator 100 that operates while switching between the standby mode and the active mode. However, a regulator for the active mode and a regulator for the standby mode may be separately provided, and the selector 16, the pulse generating part 17, and the compulsory drive circuit 18 may be provided only in the regulator for the active mode.

Although the internal source voltage $V_{OUT}$ generated in the voltage regulator 100 is supplied only to the memory 200 in the above-described embodiment, the internal source voltage $V_{OUT}$ may also be supplied to a different logic circuit other than the memory.

In the above-described embodiment, the circuit configured by the voltage-dividing circuit (R0 and R1) and the differential amplification part (P0, P1, and N0 to N3) is employed as the drive voltage generation circuit 13 for driving the output transistor 14. However, any circuit configuration may be employed as long as it can generate the drive voltage VQ to be applied to the gate terminal of the output transistor 14.

In the above-described embodiment, the p-channel MOS transistor P7 having the drain terminal and the source terminal connected together is employed as a capacitor element included in the compulsory drive circuit 18. However, an n-channel MOS transistor or a capacitor element having other structure may be employed instead.

In the above-described compulsory drive circuit 18, the n-channel MOS transistor N5 is employed as a first switching element for applying the ground voltage VSS to the gate terminal of the transistor P7 as a capacitor element. However, a p-channel MOS transistor or a switching element having other structure may be employed instead. In the compulsory drive circuit 18, the p-channel MOS transistor P6 is employed as a second switching element for connecting the gate terminal of the transistor P7 to the gate terminal of the output transistor 14. However, an n-channel MOS transistor or a switching element having other structure may be employed instead.

Although the p-channel MOS transistor is employed as the output transistor 14 in the above-described embodiment, an n-channel MOS transistor may be employed instead.

At this time, the transistor P6 and the transistor P7 as a capacitor element in the compulsory drive circuit 18 are changed to n-channel MOS transistors, and the transistor N5 is changed to a p-channel MOS transistor. Instead of the ground voltage VSS, the source voltage VDD is applied to the source terminal of the transistor N5. Furthermore, the ground voltage VSS is fixedly applied to the gate terminal of the transistor P7 as a capacitor element, and the drain terminal of the transistor P7 and the source terminal of the transistor P7 are both connected to the line $L_P$. A signal, which is obtained by inverting the logic level of the compulsory drive pulse signal PS, is provided to the gate terminals of the transistors N5 and P6. With such a configuration, the transistor P6 is set in an OFF state and the transistor N5 is set in an ON state while the mode specification signal MOD is in the state representing the standby mode. Thus, a certain amount of negative charge is accumulated in the gate terminal of the transistor P7, and positive charge is accumulated in the drain and source terminals thereof. Thereafter, when the mode specification signal MOD transitions from the state representing the standby mode to the state representing the active mode, the transistor P6 is set in an ON state and the transistor N5 is set in an OFF state only for the pulse duration ST shown in FIG. 3. Consequently, the drain terminal and the source terminal of the transistor P7 as a capacitor element are connected to the drive line $L_D$ via the transistor P6. This causes the transistor P7 to discharge and thus causes current to flow into the drive line $L_D$ via the transistor P6. Consequently, voltage in the drive line $L_D$ increases instantly. Therefore, the output transistor 14 can reach a state capable of outputting a high current irrespective of the drive voltage VQ generated in the drive voltage generation circuit 13.

In sum, the voltage regulator 100 generates the internal source voltage ($V_{OUT}$) based on the source voltage (VDD) in the operational mode is selected from either the active mode or the standby mode. It is only required that the voltage regulator 100 includes the following drive voltage generating part (13), output transistor (14), and compulsory drive circuit (18). The drive voltage generating part generates the drive voltage (VQ) and then applies the drive voltage (VQ) to the drive line ($L_D$). The output transistor outputs a voltage corresponding to the voltage value of the drive line as the internal source voltage. The compulsory drive circuit includes: the capacitor element (P7) that receives the source voltage at one end (the drain terminal and the source terminal); the first switching element (N5); and the second switching element (P6). The first switching element receives the ground voltage and applies the ground voltage to the other end (gate terminal) of the capacitor element by being set in an ON state over the period in which the selected operational mode is the standby mode. The second switching element that connects the other end of the capacitor element to the drive line only for a predetermined period in an ON state when the operational mode transitions from the standby mode to the active mode.

This application is based on Japanese Patent Application No. 2015-85661 which is herein incorporated by reference.

What is claimed is:

1. A voltage regulator configured to generate an internal source voltage on the basis of a source voltage in an operational mode is selected from either an active mode or a standby mode, said voltage regulator comprising:
    a drive voltage generating part configured to generate a drive voltage and then apply said drive voltage to a drive line;
    an output transistor configured to output a voltage corresponding to a voltage value of said drive line as said internal source voltage; and
    a compulsory drive circuit including a capacitor element configured to receive said source voltage at one end, a first switching element configured to receive a ground voltage and apply said ground voltage to the other end of said capacitor element by being set in an ON state over a period in which the selected operational mode is said standby mode, and a second switching element that connects said other end of said capacitor element to said drive line only for a predetermined period in an ON state when said operational mode transitions from said standby mode to said active mode.

2. The voltage regulator according to claim 1, wherein said output transistor is a p-channel MOS transistor including: a source terminal that receives said source voltage; a gate terminal connected to said drive line; and a drain terminal that outputs said internal source voltage.

3. The voltage regulator according to claim 2, wherein said capacitor element is a p-channel MOS transistor including: a gate terminal as said other end; and a drain terminal and a source terminal connected together as said one end.

4. The voltage regulator according to claim 1, wherein said drive voltage generating part comprises:
    a voltage-dividing circuit configured to obtain a divided voltage by diving a voltage value of said internal source voltage; and
    a differential amplification part configured to generate the drive voltage having a voltage value corresponding to a difference between said divided voltage and a reference voltage.

5. The voltage regulator according to claim 1, comprising a pulse generating part configured to generate a drive pulse signal having a first logic level while the selected operational mode is said standby mode and having a second logic level only for said predetermined period from a point at which said standby mode transitions to said active mode,
    wherein said first switching element is set in an ON state when said drive pulse signal has the first logic level, and said first switching element is set in an OFF state when said drive pulse signal has the second logic level, and
    said second switching element is set in an OFF state when said drive pulse signal has the first logic level, and said second switching element is set in the ON state when said drive pulse signal has the second logic level.

6. The voltage regulator according to claim 5, comprising a circuit configured to set an output of said compulsory drive circuit in a high-impedance state according to a compulsory drive disabling signal.

7. A semiconductor device comprising:
    a memory; and
    a voltage regulator configured to generate an internal source voltage on the basis of a source voltage in an operational mode is selected from either an active mode or a standby mode to supply said internal source voltage to said memory, said voltage regulator including:
    a drive voltage generating part configured to generate a drive voltage and then apply said drive voltage to a drive line;
    an output transistor configured to output a voltage corresponding to a voltage value of said drive line as said internal source voltage; and
    a compulsory drive circuit including a capacitor element configured to receive said source voltage at one end, a first switching element configured to receive a ground voltage and apply said ground voltage to the other end of said capacitor element by being set in an ON state over a period in which the selected operational mode is said standby mode, and a second switching element that connects said other end of said capacitor element to said drive line only for a predetermined period in an ON state when said operational mode transitions from said standby mode to said active mode.

8. A voltage generation method in a voltage regulator that includes: a drive voltage generating part configured to generate a drive voltage and then apply said drive voltage to a drive line; an output transistor configured to output, on the basis of a source voltage, a voltage corresponding to a voltage value of said drive line as an internal source voltage; and a capacitor element, and operates in an operational mode is selected from either a standby mode or an active mode, said voltage generation method in said voltage regulator comprising:

applying said source voltage to one end of said capacitor element;

applying a ground voltage to the other end of said capacitor element during a period in which the selected operational mode is said standby mode; and connecting said other end of said capacitor element to said drive line only for a predetermined period when said operational mode transitions from said standby mode to said active mode.

* * * * *